US006586777B1

(12) United States Patent
Yuasa et al.

(10) Patent No.: US 6,586,777 B1
(45) Date of Patent: Jul. 1, 2003

(54) NITRIDE SEMICONDUCTOR LIGHT EMITTING DEVICE

(75) Inventors: Takayuki Yuasa, Nara (JP); Atsushi Ogawa, Nara (JP); Masahiro Araki, Nara (JP); Yoshihiro Ueta, Nara (JP); Yuhzoh Tsuda, Nara (JP); Mototaka Taneya, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/641,876

(22) Filed: Aug. 18, 2000

(30) Foreign Application Priority Data

Aug. 20, 1999  (JP) ............................. 11-233624
Aug. 1, 2000   (JP) ........................... 2000-233010

(51) Int. Cl.[7] ............................. H01L 33/00; H01S 5/00
(52) U.S. Cl. ........................... 257/103; 257/96; 257/97; 438/47; 372/44
(58) Field of Search ............................. 257/12–14, 15, 257/76, 103, 79, 96, 97, 101, 102; 438/46, 47, 481, 493, 497, 500, 503, 507; 372/44; 117/1, 92, 97, 952

(56) References Cited

U.S. PATENT DOCUMENTS 5,993,542 A * 11/1999 Yanashima et al. ......... 117/384
6,177,292 B1 * 1/2001 Hong et al. ................... 438/46
6,320,207 B1 * 11/2001 Furukawa et al. .......... 257/101
6,455,877 B1 * 9/2002 Ogawa et al. ................ 257/99
6,518,602 B1 * 2/2003 Yuasa et al. ................ 257/102

OTHER PUBLICATIONS

"InGaN/GaN/AlGaN–Based Laser Diodes with Cleaved Facets Grown on GaN Substrates", S. Nakamura et al., Applied Physics Letters vol. 73, No. 6, Aug. 10, 1998, pp. 832–834.

"Room–Temperature Continuous–Wave Operation of InGaN Multi–Quantum–Well Laser Diodes Grown on an n–GaN Substrate with a Backside n–Contact", M. Kuramoto et al., Jpn. J. Appl. Phys. vol. 38 pp. L184–L186, Part 2 No. 2B, Feb. 15, 1999.

* cited by examiner

Primary Examiner—Tom Thomas
Assistant Examiner—Donghee Kang
(74) Attorney, Agent, or Firm—Morrison & Foerster LLP

(57) ABSTRACT

The present nitride semiconductor light emitting device includes a nitride semiconductor thick film substrate and a light emitting layered structure including a plurality of nitride semiconductor layers stacked on the substrate. The nitride semiconductor substrate includes at least two layer regions including a first layer region of a high impurity concentration and a second layer region of an impurity concentration lower than the first layer region. The light emitting layered structure is formed on the first layer region of the substrate.

14 Claims, 17 Drawing Sheets

IMPURITY CONCENTRATION IN GROWTH
TERMINATING REGION OF THICK FILM GaN (cm$^{-3}$)

NITRIDE SEMICONDUCTOR LIGHT EMITTING DEVICE

BACKGROUND OF THE INVENTION

1. Field of the Invention

The present invention relates to a nitride semiconductor light emitting device including a nitride semiconductor substrate and a light emitting layered structure that includes a plurality of nitride semiconductor layers stacked on the nitride semiconductor substrate.

2. Description of the Background Art

Conventionally, the characteristics of nitride semiconductors are utilized and studied for light emitting devices and high power devices. For instance, when a light emitting device is produced using a nitride semiconductor, the composition of the semiconductor is adjusted to provide a light emitting device capable of emitting any desired monochromatic light within a wide range of colors from purple to orange. In recent years, use is made of the characteristics of nitride semiconductors to provide practical applications of a blue light emitting diode or a green light emitting diode, and a bluish-purple light emitting semiconductor laser is being developed for use as a semiconductor laser device. When forming a nitride semiconductor film, a sapphire, SiC, spinel, Si, or GaAs substrate is used.

For example, when a sapphire substrate is used, a GaN or AlN buffer layer is formed in advance at a relatively low temperature of 500° C. to 600° C. prior to the epitaxial growth of a GaN film, and thereafter, the substrate is heated to a high temperature of 1000° C. to 1100° C. to have the GaN film epitaxially grown. It is known that, in this manner, a GaN film having good surface properties and being formed of a structurally and electrically good crystal can be produced. In addition, when an SiC substrate is used, it is known that a thin AlN film may be used as a buffer layer when the GaN film is epitaxially grown.

When a substrate other than that of a nitride semiconductor such as GaN is used, however, numerous crystal defects will be introduced in the produced nitride semiconductor film due to the differences of the thermal expansion coefficient and of the lattice constant between the non-nitride semiconductor substrate and the nitride semiconductor film grown thereon. Such defects can be categorized into two groups, i.e., edge dislocation and screw dislocation, and the total dislocation density amounts to as much as about $1 \times 10^9$ $cm^{-2}$ to $1 \times 10^{10}$ $cm^{-2}$. These defects are known to degrade the electric characteristics of the film by trapping carriers and also to result in the degradation of the lifetime of a laser having a large current flowing through it.

Thus, attempts are being made to form a thick film such as a GaN thick film using the hydride vapor phase epitaxy (H-VPE) method, the high pressure synthesis method, or the sublimation method and to use this thick film as a nitride semiconductor substrate in order to produce a nitride semiconductor film with reduced lattice defects and with good electric characteristics. When a nitride semiconductor thick film is used as the substrate, the thick film is doped with impurities to reduce the electric resistance that is brought high due to the reduction in the defect density and to the decrease in the residual carrier concentration in the thick film.

When the GaN thick film is to be grown by the H-VPE method as in the conventional example, however, doping of impurities of a prescribed concentration alone does not ensure good quality and electric characteristics of a crystal of the GaN thick film obtained (hereinafter, the term "thick film" will be used to signify a film having a thickness of 20 $\mu$m or greater unless otherwise specified). For instance, the use of a GaN thick film substrate formed by doping impurities of a prescribed high concentration for a nitride semiconductor laser device lowers the threshold voltage of the laser device but tends to increase the threshold current density. Moreover, the surface morphology of the GaN thick film substrate becomes very poor, and the quality of the crystal also is not satisfactory.

On the other hand, when a GaN thick film substrate formed by doping impurities of a prescribed low concentration is used for the nitride semiconductor laser device, the surface morphology of the GaN thick film substrate is good and the threshold current density of the laser device is lowered, but the threshold voltage tends to increase, instead. Thus, a nitride semiconductor substrate (for example, a GaN thick film substrate) that does not degrade the electric characteristics of the nitride semiconductor light emitting device is desired.

SUMMARY OF THE INVENTION

In view of the above-described background art, an object of the present invention is to provide a nitride semiconductor light emitting device having excellent characteristics using a nitride semiconductor thick film substrate.

To solve the above problems, it is required to establish a good electrical contact between the surface of a nitride semiconductor thick film to be used as the substrate and the light emitting layered structure formed by epitaxial growth. It is important to control the growth conditions appropriately so that good continuity of the epitaxial growth can be ensured.

According to the present invention, the nitride semiconductor light emitting device includes a nitride semiconductor substrate and a light emitting layered structure including a plurality of nitride semiconductor layers stacked on the substrate, wherein the nitride semiconductor substrate includes at least two layer regions including a first layer region of a high impurity concentration and a second layer region of an impurity concentration that is lower than the first layer region, and the light emitting layered structure is formed on the first layer region of the substrate.

The nitride semiconductor substrate is preferably of the n-type conductivity. Thus, the first layer region of the nitride semiconductor substrate preferably includes conductivity-type determining impurities for n-type. Silicon, germanium, oxygen, carbon, sulfur, selenium, or tellurium may be used as impurities to be included in the nitride semiconductor substrate.

The impurity concentration of the first layer region of the nitride semiconductor substrate preferably is $1 \times 10^{18}$ $cm^{-3}$ or higher. On the other hand, the nitride semiconductor substrate preferably includes a layer region having the lowest impurity concentration of $8 \times 10^{18}$ $cm^{-3}$ or lower. In addition, the first layer region of the nitride semiconductor substrate preferably has a thickness that is not greater than 10 $\mu$m.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Of the possible methods of growing a nitride semiconductor thick film including the H-VPE method, the high pressure synthesis method, and the sublimation method, the H-VPE method is most preferred when the film is to be grown without thickness variation over a large area. The present embodiment will describe a nitride semiconductor light emitting device that utilizes as the nitride semiconductor substrate a GaN thick film formed on a sapphire substrate by the H-VPE method.

First, a sapphire substrate having a (0001) plane was washed and rinsed, and a non-doped GaN film about 2 μm thick was grown thereon as an underlying layer using the MOCVD (metal organic chemical vapor deposition) method in the following manner. The sapphire substrate washed and rinsed was introduced into an MOCVD apparatus, and was cleaned at a high temperature of approximately 1100° C. in a hydrogen ($H_2$) atmosphere. Then, a GaN buffer layer about 20 nm thick was grown at a relatively low temperature of 600° C. by introducing $NH_3$ at 5 l/min and trimethylgallium (TMG) at 20 μmol/min with a carrier gas $H_2$ at the flow rate of 10 l/min. Then, the supply of TMG was temporarily interrupted to raise the temperature to about 1050° C., and thereafter, TMG at approximately 100 μmol/min was introduced to grow a non-doped GaN film about 3 μm in thickness in an hour. Then, the supplies of TMG and $NH_3$ were stopped and the temperature was brought down to room temperature, and the sapphire substrate with the non-doped GaN underlying layer formed thereon was taken out of the MOCVD apparatus. Not only the GaN film but also an AlN film or a GaAlN film may be formed for use as the buffer layer by selectively using trimethylaluminium (TMA), TMG, and $NH_3$.

Then, when forming a thick film on the non-doped GaN underlying layer which was formed on the sapphire substrate in the above-described manner, a stripe-like growth suppressing film with a thickness of about 0.2 μm and a width of 7 μm and provided at a spacing of 10 μm was formed in order to avoid formation of cracks in the thick film, and a flat GaN thick film was formed thereon by selective growth (involving lateral epitaxial growth) using the H-VPE method. In the present embodiment, an $SiO_2$ film deposited by the electron beam evaporation (EB) method and etched by photolithography was used as the growth suppressing film.

Figure 1:
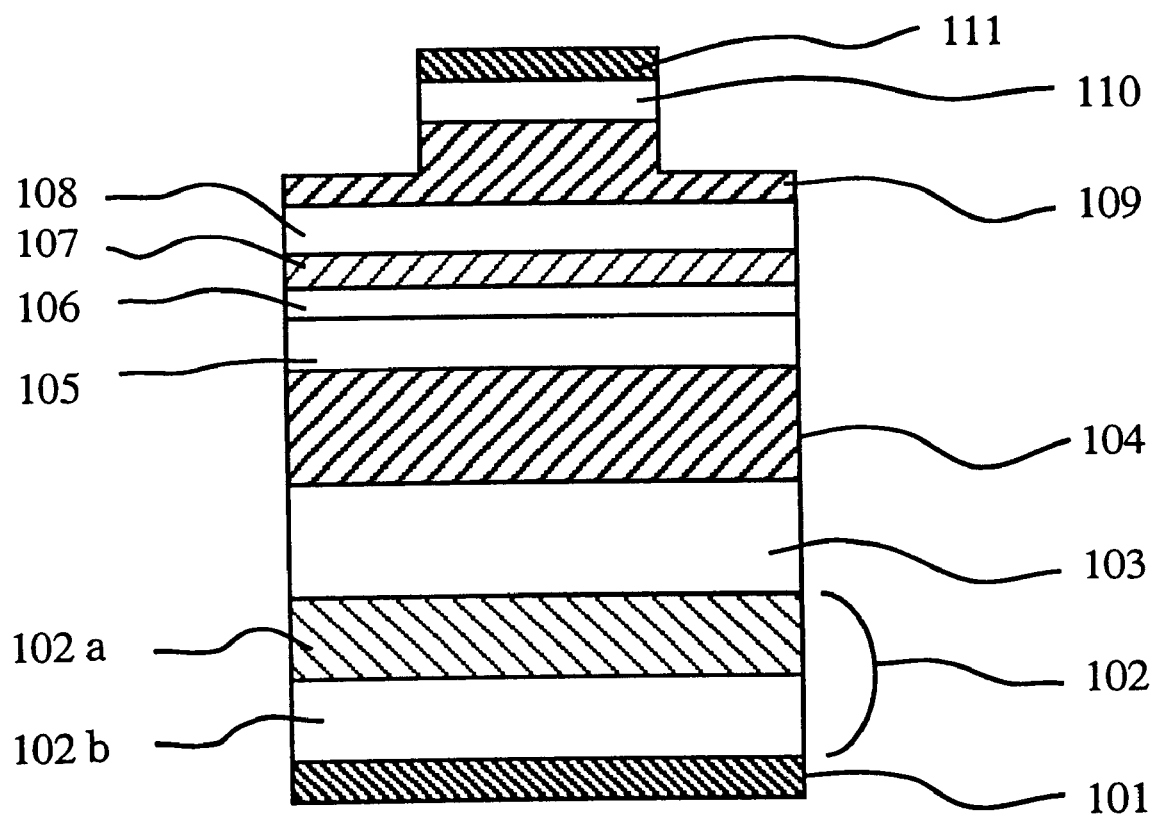
FIG. 1 is a schematic cross sectional view representing a nitride semiconductor laser device according to one embodiment of the present invention.

A growth method using the H-VPE method of a GaN thick film 102 as shown in FIG. 1 will be described below. The sapphire substrate having a non-doped GaN underlying layer formed thereon that includes a stripe-like growth suppressing film formed in the above-described manner was introduced into an H-VPE apparatus. $N_2$ carrier gas and $NH_3$ each with the flow rate of 5 l/min were introduced, and the substrate was heated to about 1050° C. Then, GaCl at 100 cc/min was introduced onto the substrate, thereby starting the growth of GaN thick film 102. GaCl was formed by reacting an HCl gas with metal Ga maintained at about 800° C. Impurity doping could be effected as desired during the film growth by supplying the impurity gas through a single doping line arranged extending to the vicinity of the substrate. In the present embodiment, monosilane ($SiH_4$) at 200 nmol/min was supplied (Si impurity concentration: approximately $3.8 \times 10^{18}$ cm$^{-3}$) at the same time as the start of the film growth so as to grow a low Si-doped GaN layer region 102b. Then, three minutes before the completion of the film growth, the flow rate of $SiH_4$ was increased to 500 nmol/min (Si impurity concentration: approximately $8.0 \times 10^{18}$ cm$^{-3}$) to allow the growth of a high Si-doped GaN layer region 102a to the thickness of approximately 5 μm.

For doping of Si, not only $SiH_4$ but also other material such as monochlorosilane ($SiH_3Cl$), dichlorosilane ($SiH_2Cl_2$), or trichlorosilane ($SiHCl_3$) may be used. The film was allowed to grow for three hours in the above-described manner, and a GaN thick film of approximately 350 μm in total thickness was grown. Thereafter, the sapphire substrate was removed by polishing, and GaN thick film substrate 102 was obtained.

A light emitting layered structure was formed by the MOCVD method on GaN thick film substrate 102 thus obtained. An example in which a bluish-purple laser layered structure was formed on GaN thick film substrate 102 will be described below.

First, GaN thick film substrate 102 was introduced into an MOCVD apparatus, and the temperature was raised to about 1050° C. as $N_2$ and $NH_3$ were each introduced with the flow rate of 5 l/min. When the temperature of approximately 1050° C. was reached, an n-type GaN buffer layer 103 was grown to the thickness of about 4 μm by introducing TMG at 100 μmol/min and $SiH_4$ at 10 nmol/min using carrier gas $H_2$. Then, the rate of TMG was adjusted to 50 μmol/min, and TMA at 40 μmol/min was introduced to grow an n-type $Al_{0.1}Ga_{0.9}N$ cladding layer 104 to the thickness of 0.5 μm. Next, the supply of TMA was stopped, and the rate of TMG was adjusted back to 100 μmol/min to grow an n-type GaN light propagation layer 105 to the thickness of 0.1 μm.

Then, the supply of TMG was stopped, and $H_2$ carrier gas was changed to $N_2$. The temperature was brought down to 700° C., and trimethylindium (TMI) of 10 μmol/min as an indium material as well as TMG at 15 μmol/min was introduced to grow an $In_{0.05}Ga_{0.95}N$ barrier layer (not shown) to the thickness of 4 nm. Thereafter, the amount of TMI supply was increased to 50 μmol/min to grow an $In_{0.2}Ga_{0.8}N$ quantum well layer (not shown) to the thickness of 2 nm. In the similar manner, the barrier layer and the well layer were alternately formed until a multi quantum-well (MQW) layer 106 including four barrier layers and three well layers was formed. Upon the completion of MQW layer 106, the supplies of TMI and TMG were stopped, and the temperature was again raised to 1050° C. The carrier gas $N_2$ was changed back to $H_2$, and TMG of 50 μmol/min, TMA of 30 μmol/min, and bis(cyclo-pentadienyl) magnesium ($Cp_2Mg$) of 10 nmol/min as a p-type doping material were supplied to grow a p-type $Al_{0.2}Ga_{0.8}N$ carrier block layer 107 that was 20 nm thick. Then, the supply of TMA was stopped, the amount of TMG supply was adjusted to 100 μmol/min, and a 0.1 μm thick p-type light propagation layer 108 was grown. Thereafter, the TMG supply was adjusted to 50 μmol/min and TMA of 40 μmol/min was introduced to grow a p-type $Al_{0.1}Ga_{0.9}N$ cladding layer 109 to the thickness of 0.4 μm. Finally, TMG was adjusted back to 100 μmol/min and the supply of TMA was stopped to grow a 0.1 μm thick p-type GaN contact layer 110, whereby the growth of the light emitting layered structure was completed. Then, the supplies of TMG and $Cp_2Mg$ were stopped, the temperature was brought down to room temperature, and the light emitting layered structure formed on thick film substrate 102 was taken out from the MOCVD apparatus.

The average value Ra of the surface roughness of the outermost surface of the film included in the laser layered structure is about 8 nm, exhibiting good flatness. Then, an optical waveguide was formed by etching p-type GaN contact layer 110 down to p-type $Al_{0.1}Ga_{0.9}N$ cladding layer 109, leaving p-type GaN contact layer 110 in 5 μm-wide stripes using a dry etching apparatus. Thereafter, an Au/Pd electrode 111 was formed on p-type GaN contact region 110, while an Al/Ti electrode 101 was formed on a backside of GaN thick film substrate 102. Finally, the light emitting element was processed by cleavage or by dry etching method so that the cavity length was about 1 mm and mirror surfaces were formed thereto.

In the above-described manner, a bluish-purple light emitting laser device can be produced using a nitride semiconductor, as shown in FIG. 1. The laser device produced according to the this embodiment had a threshold voltage of approximately 5V and a threshold current density of 1 $kA/cm^2$ required for lasing, and no degradation in characteristics was observed as a result of the life test of about 1000 hours under the conditions in the vicinities of these threshold values. Moreover, the first embodiment involves growing GaN thick film 102 on the sapphire substrate, then removing the sapphire substrate, and thereafter forming a nitride semiconductor light emitting layered structure on GaN thick film substrate 102; however, the nitride semiconductor light emitting layered structure may first be formed on GaN thick film 102 and the sapphire substrate may then be removed. Furthermore, the same effects as those derived by the first embodiment may be obtained using a thick film substrate formed of a nitride semiconductor ($Al_xGa_yIn_{1-x-y}N$: $0 \leq x \leq 1$, $0 \leq y \leq 1$) other than the GaN thick film substrate. In addition, a material having a portion (about 10% or less) of the nitrogen among the nitride semiconductor-forming elements replaced by P, As, or Sb may be used for the thick film substrate to produce the same effects as those derived by the first embodiment.

Second Embodiment

In the laser devices according to the second embodiment, the Si doping concentrations were variously changed device by device when forming GaN thick film substrates by the H-VPE method, while other manufacturing conditions were similar to those of the first embodiment.

First of all, a sapphire substrate having formed thereon a non-doped GaN underlying layer that includes a stripe-like growth suppression film by a method similar to that described in the first embodiment was introduced into an H-VPE apparatus, and the substrate was heated to about 1050° C. while $N_2$ carrier gas and $NH_3$, each with the flow rate of 5 l/min, were introduced. Then, GaCl of 100 cc/min was introduced onto the substrate to start the growth of a GaN thick film 102. At this start of the film growth, $SiH_4$ gas was supplied such that the impurity doping concentration was at $5 \times 10^{17}$ $cm^{-3}$, $1 \times 10^{18}$ $cm^{-3}$, $3 \times 10^{18}$ $cm^{-3}$, $5 \times 10^{18}$ $cm^{-3}$, or $8 \times 10^{18}$ $cm^{-3}$ to grow an Si-doped GaN film, and three minutes before the completion of the GaN film growth to the total thickness of 350 μm, the flow rate of $SiH_4$ was increased in a proportion selected from various proportions so that a higher doping concentration was attained in growth terminating region 102a. In all cases, however, the concentration in growth terminating region 102a was set to be approximately $2 \times 10^{19}$ $cm^{-3}$ or below. Then, the laser devices were produced using a method similar to that described in relation to the first embodiment.

Figure 2:
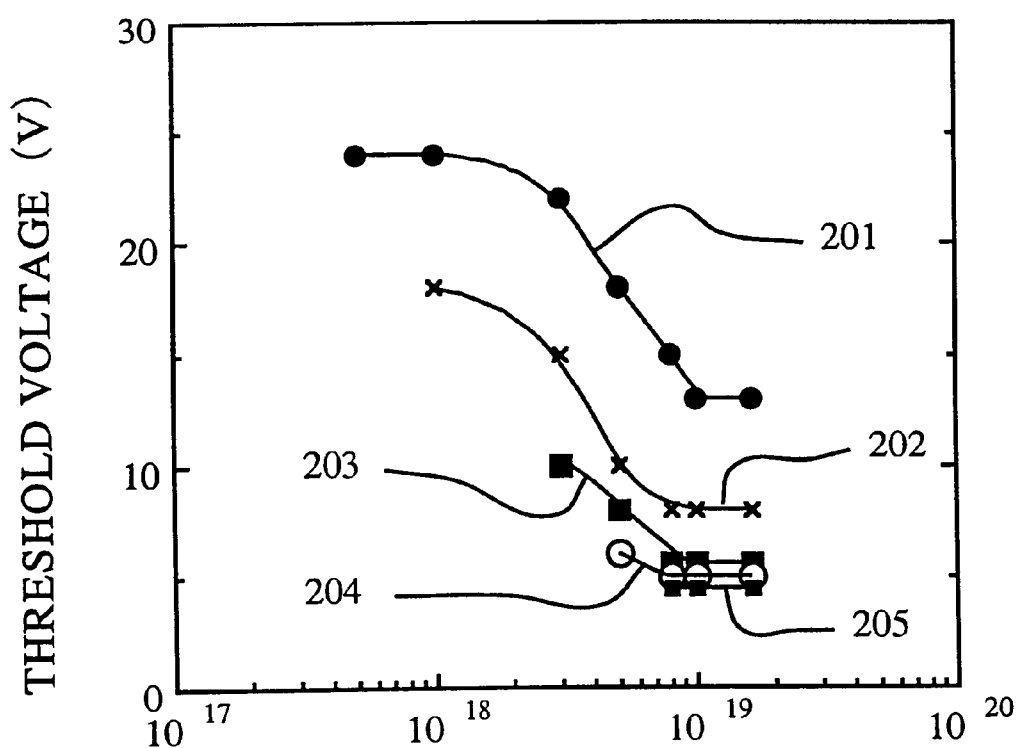
FIG. 2 is a graph illustrating the relation between the impurity concentrations in the growth terminating regions of GaN thick film substrates and the threshold voltages of the laser devices including the substrates.

The graph of FIG. 2 indicates the threshold voltage values of the various laser devices produced in the second embodiment. In this graph, the vertical axis shows a threshold voltage and the horizontal axis shows an impurity concentration in growth terminating region 102a of a GaN thick film substrate. Moreover, reference numerals 201, 202, 203, 204, and 205 correspond to Si doping concentrations set at $5 \times 10^{17}$ $cm^{-3}$, $1 \times 10^{18}$ $cm^{-3}$, $3 \times 10^{18}$ $cm^{-3}$, $5 \times 10^{18}$ $cm^{-3}$, and $8 \times 10^{18}$ $cm^{-3}$, respectively, at the start of the growth of the GaN thick film substrates.

As shown in FIG. 2, a decrease in the threshold voltage is observed when the impurity concentration of growth terminating region 102a of GaN thick film substrate 102 is $1 \times 10^{18}$ $cm^{-3}$ or above. It is to be noted, however, that this effect is most conspicuous when the impurity concentration of growth terminating region 102a is $3 \times 10^{18}$ $cm^{-3}$ or above. On the contrary, doping of the thick film substrate with excessive impurity concentration increases the crystal defect within the epitaxial layer grown thereon so that the impurity concentration in growth terminating region 102a of the thick film substrate preferably is in the range of $3 \times 10^{18}$ $cm^{-3}$ to $1 \times 10^{19}$ $cm^{-3}$.

Moreover, the rate of decrease in the threshold voltage due to the high impurity concentration of growth terminating region 102a is strikingly great when the impurity concentration of other region 102b within GaN thick film substrate 102 excluding growth terminating region 102a is $8 \times 10^{18}$ $cm^{-3}$ or below. It is to be noted, however, that the threshold current density tends to increase (see FIG. 5) as the impurity concentration in the region of the GaN thick film substrate excluding growth terminating region 102a exceeds $3 \times 10^{18}$ $cm^{-3}$, while the resistance of the substrate itself becomes too great when the impurity concentration is $1 \times 10^{17}$ $cm^{-3}$ or below. Thus, the impurity concentration of other region 102b of GaN thick film substrate 102 excluding growth terminating region 102a is preferably in the range of $1 \times 10^{17}$ $cm^{-3}$ to $3 \times 10^{18}$ $cm^{-3}$.

Furthermore, although the second embodiment was described in relation to the example which involved doping of Si as a kind of impurity, similar tendencies were observed using other kinds of impurities that cause the n-type conductivity.

First Comparative Example

In the laser devices according to the first comparative example, also, the Si doping concentrations were variously changed device by device when forming GaN thick film substrates by the H-VPE method. The first comparative example, however, differs from the first and second embodiments in that the doping concentration set at the start of the growth of a GaN thick film substrate is maintained at a constant value until the end of the growth.

Figure 3:
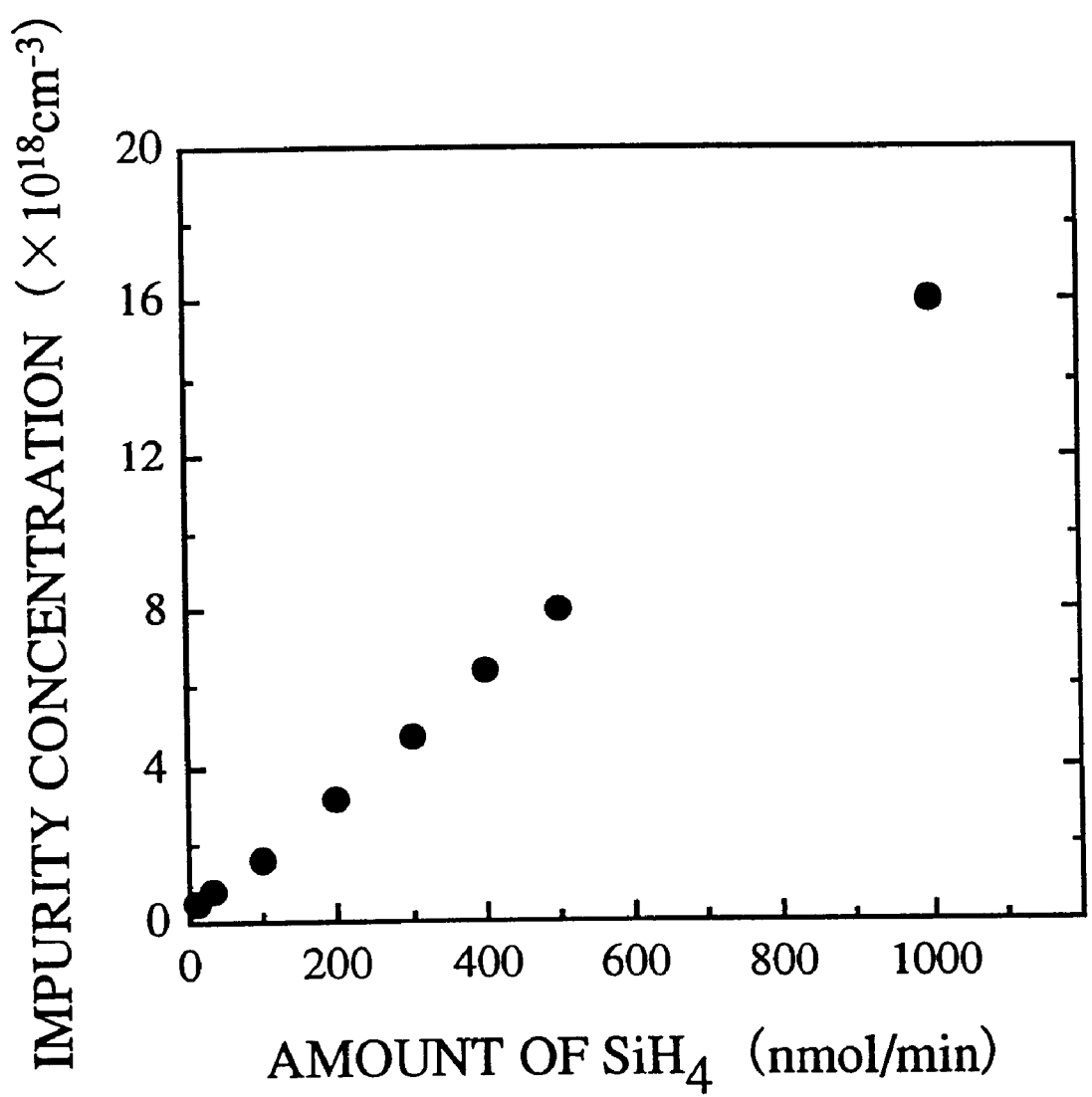
FIG. 3 is a graph illustrating the relation between the amount of $SiH_4$ introduced and the concentration of impurities included in the substrate when the growth of a GaN thick film substrate is effected.

More specifically, during the growth of GaN thick film substrates by the H-VPE method, the respective flow rates of $SiH_4$ were maintained at various constant values within the range of 10 nmol/min to 1000 nmol/min. Thus, various kinds of GaN thick film substrates of different impurity concentrations were formed, and the characteristics of the laser layered structures formed on the substrates were measured. As shown in FIG. 3, the amount of $SiH_4$ supplied is in proportional relation to the impurity concentration in GaN thick film substrates, and when the amount of $SiH_4$ was 1000 nmol/min, the impurity concentration was $1.6 \times 10^{19}$ cm$^{-3}$. The relation between the impurity concentrations in GaN thick film substrates thus formed and the threshold voltages of laser layered structures formed thereon is shown in FIG. 4, the relation between the impurity concentrations in the substrates and the threshold current densities is shown in FIG. 5, and the relation between the impurity concentrations and average surface roughness of the substrates is shown in FIG. 6.

Figure 4:
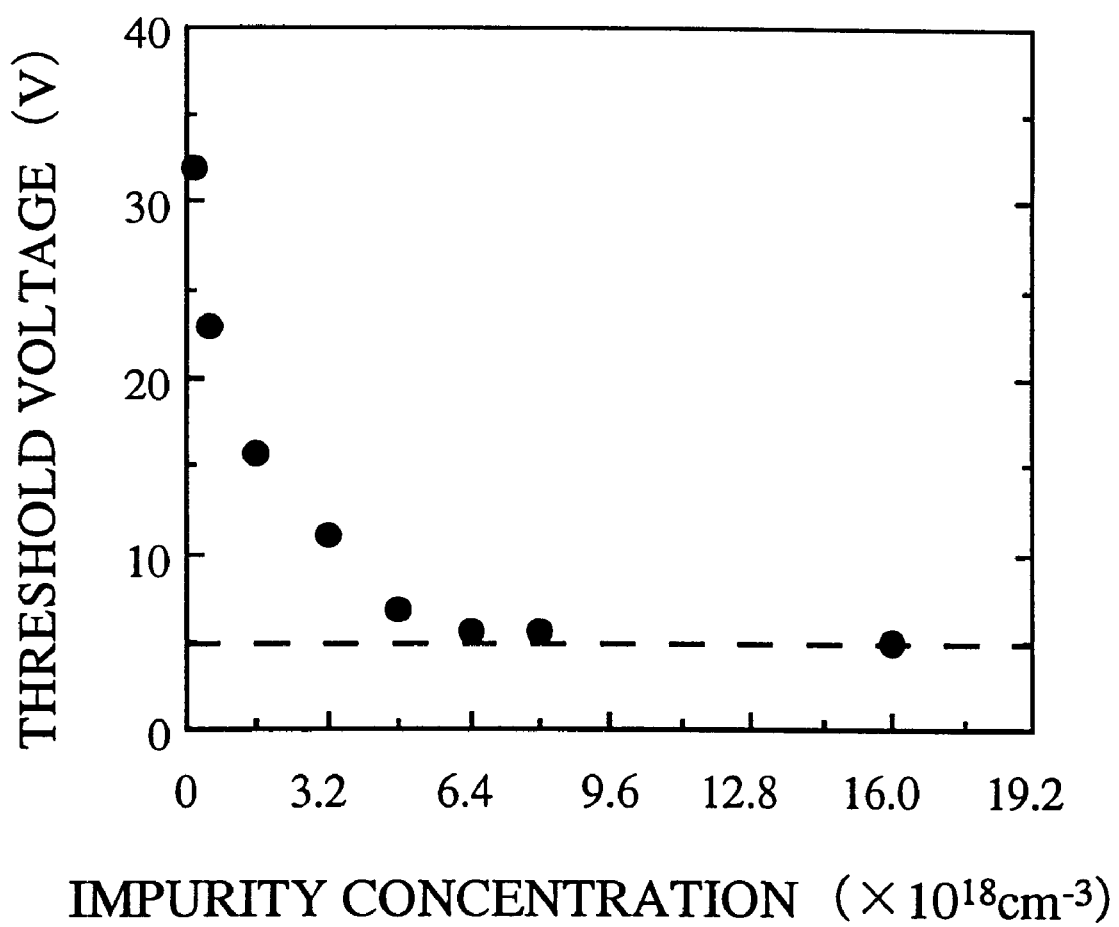
FIG. 4 is a graph illustrating the relation between impurity concentration in GaN thick film substrates and threshold voltage of laser devices including the substrates.

As seen from FIG. 4, the threshold voltages of the laser devices obtained decrease as the impurity concentrations in the GaN thick film substrates increase. One reason is that the resistance of the GaN thick film substrates is lowered due to the influence of the impurities. A more important reason as discovered from the observation made by the present inventors using the electron beam induced current (EBIC) method, however, is that the reduction in the Schottky barrier generated in the region where the GaN thick film substrate contacts the bottom layer of the laser layered structure that is formed thereon using MOCVD causes the decrease in the threshold voltage. The laser oscillation threshold voltage values converge at about 5V where the impurity concentrations of the GaN thick film substrates are approximately $5 \times 10^{18}$ cm$^{-3}$ and higher. On the other hand, as shown in FIG. 5, the threshold current density for laser tends to increase where the impurity concentration of the GaN thick film substrates is approximately $3 \times 10^{18}$ cm$^{-3}$ and above. It may be concluded that this tendency is due to the fact that average surface roughness Ra of a substrate increases as the impurity concentration in a GaN thick film substrate exceeds approximately $3.2 \times 10^{18}$ cm$^{-3}$, as shown in FIG. 6. In other words, it may be said that, as the substrate surface roughness increases, the unevenness of the interface of each of the layers included in the laser layered structure that is formed on the substrate increases, resulting in increased light dispersion within propagation layer 105 that propagates the laser beam, which in turn causes the increase in the threshold current density. The first and second embodiments successfully avoid these problems by achieving a higher impurity concentration only in growth terminating region 102a of GaN thick film substrate 102.

Figure 5:
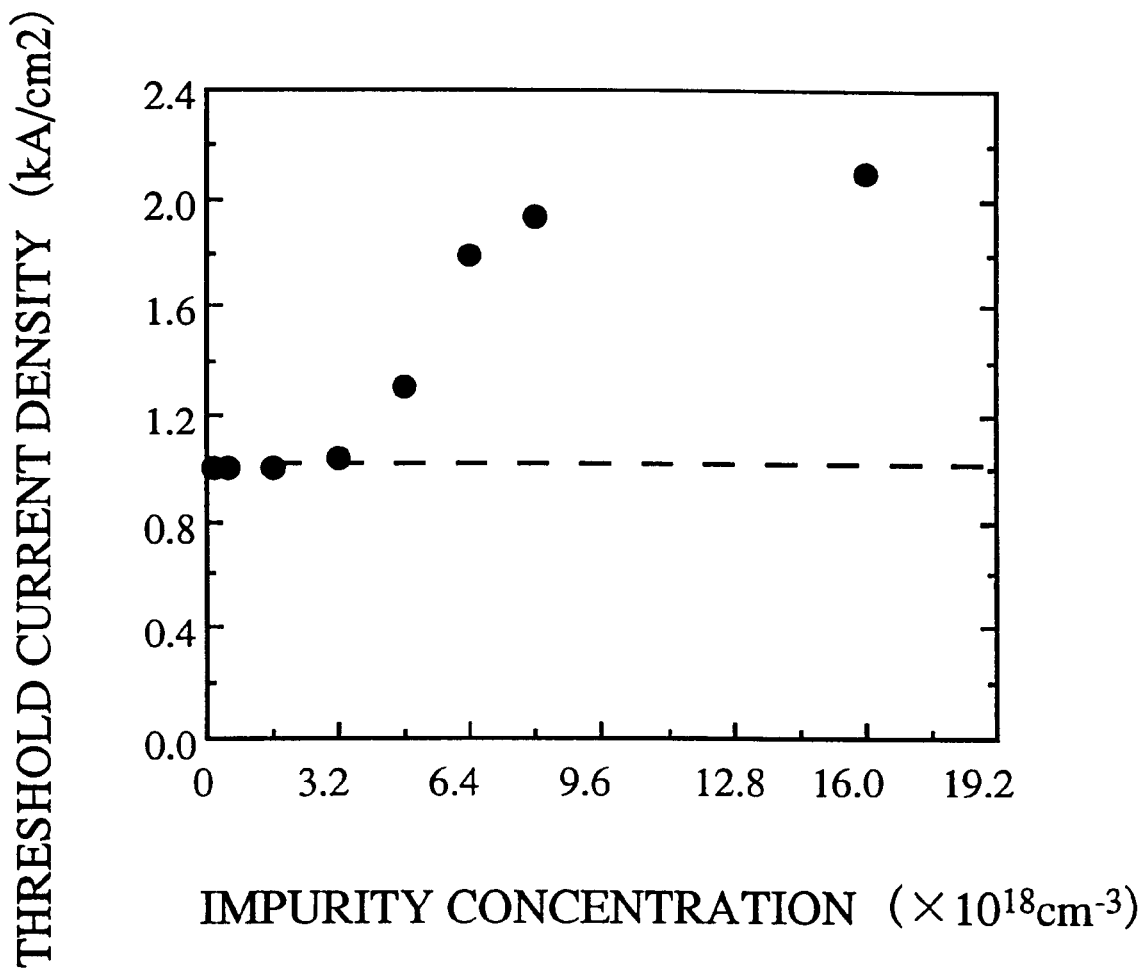
FIG. 5 is a graph illustrating the relation between the impurity concentration in the GaN thick film substrates and the threshold current density of the laser devices that include the substrates.
Figure 6:
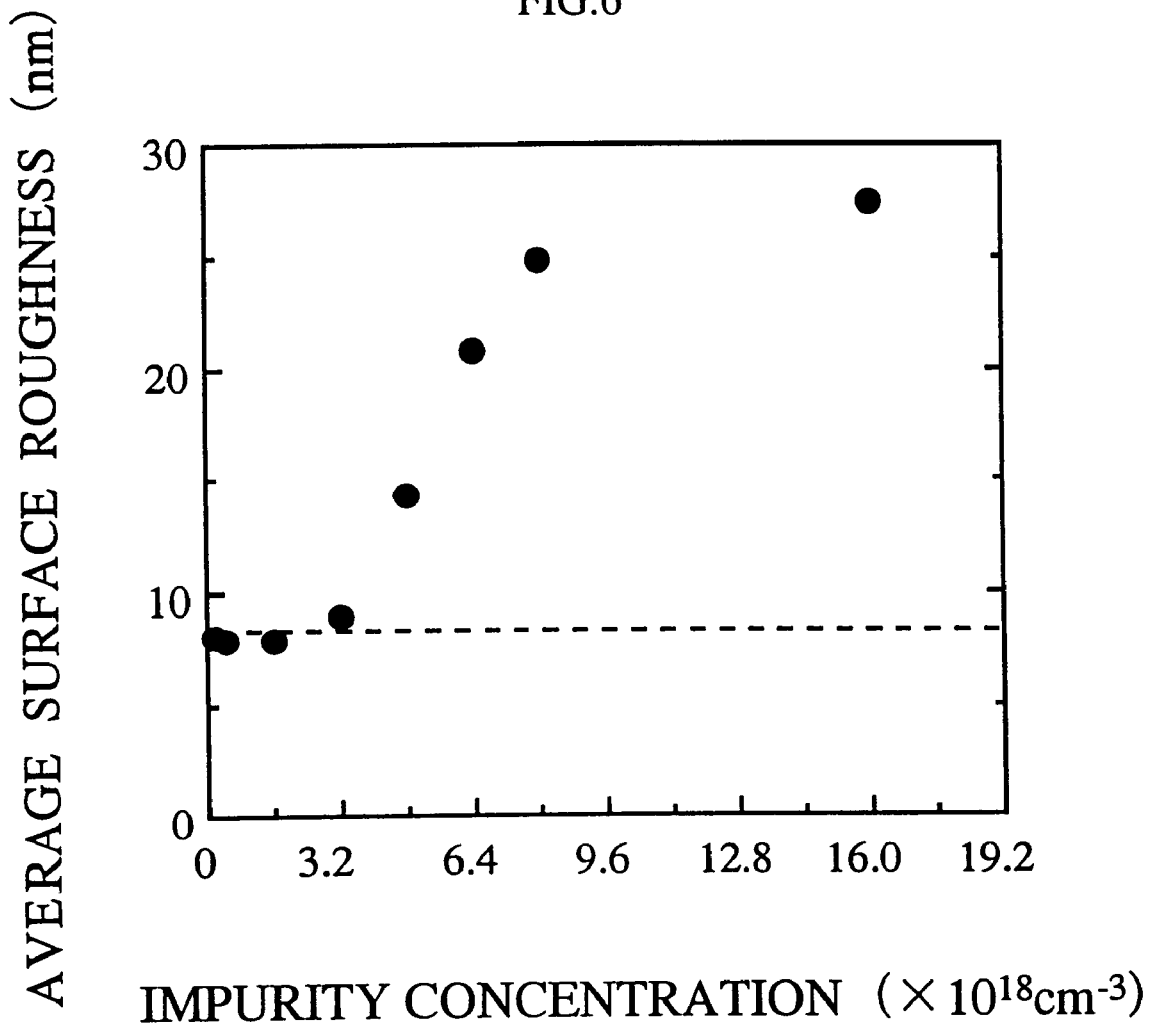
FIG. 6 is a graph illustrating the relation between the impurity concentrations in the GaN thick film substrates and surface roughness of the substrates.

For instance, the broken lines in FIGS. 4, 5, and 6 indicate the characteristic in the laser device produced according to the first embodiment (i.e., the case in FIG. 1 where the impurity concentration of high Si-doped GaN region 102a is approximately $8.0 \times 10^{18}$ cm$^{-3}$ and the impurity concentration of low Si-doped GaN region 102b is approximately $3.8 \times 10^{18}$ cm$^{-3}$). In a laser device such as one of those in the first comparative example that utilizes a GaN thick film substrate having a constant impurity concentration throughout the entire thickness, there does not exist such an appropriate constant impurity concentration in the entire substrate that achieves the characteristics equal to or better than the characteristics of the first embodiment laser device.

Third Embodiment

The third embodiment involves the production of a laser device in which the respective conductivity types of the layers in the laser device of the first embodiment were inverted. In this embodiment, like the first embodiment, a GaN thick film substrate was formed by the H-VPE method, but bis(cyclo-pentadienyl) magnesium (Cp$_2$Mg) which is an organic metal was introduced as impurities. The amount of impurities Mg introduced was increased three minutes before the completion of the film growth, and a GaN thick film having the p-type conductivity and the total thickness of 350 μm was formed. The GaN thick film substrate obtained was introduced into the MOCVD apparatus, and then, a p-type GaN buffer layer, a p-type Al$_{0.1}$Ga$_{0.9}$N cladding layer, a p-type propagation layer, an InGaN-MQW active layer, a carrier block layer, an n-type propagation layer, an n-type Al$_{0.1}$Ga$_{0.9}$N cladding layer, and an n-type contact layer were successively grown. Thereafter, the laser device was formed through a process similar to that of the first embodiment.

In the laser device produced according to the third embodiment, the decrease of 3V to 5V in the threshold voltage was observed as a result of increased impurity concentration in the growth terminating region of the p-type thick film substrate. When the p-type substrate was used, however, the threshold voltage was at least 20V regardless of the varied impurity concentrations, and no effect as favorable as that achieved by using an n-type GaN thick film substrate as the first embodiment was seen. This may be attributed to the high resistance value of the p-type substrate itself, as compared with the n-type substrate, which makes it difficult for a good contact interface to be formed.

Fourth Embodiment

In the fourth embodiment, like the first embodiment, as the growth of a GaN thick film by the H-VPE method was started, SiH$_4$ of a prescribed flow rate was introduced to grow an n-type GaN thick film. Three minutes before the completion of the film growth, however, the impurities were changed from Si to germanium (Ge) or oxygen (O), while at the same time, the impurity concentration in the growth terminating region was increased, and thus, an n-type GaN thick film including regions of different impurity concentrations was grown to the thickness of 350 μm. The GaN thick film substrate obtained was introduced into the MOCVD apparatus, and thereafter, the laser device was formed using a method similar to that of the first embodiment.

In the laser device of the fourth embodiment thus obtained, the decrease of about 1V to 20V in the threshold voltage was observed in comparison with the laser device produced according to the method of the first comparative example in which the impurity concentration of the substrate was kept unchanged. Moreover, the threshold voltage and the threshold current density were reduced to the low values of about 5V and about 1 kA/cm$^2$, respectively, by appropriately controlling the impurity concentration in the substrate.

Fifth Embodiment

Figure 7:
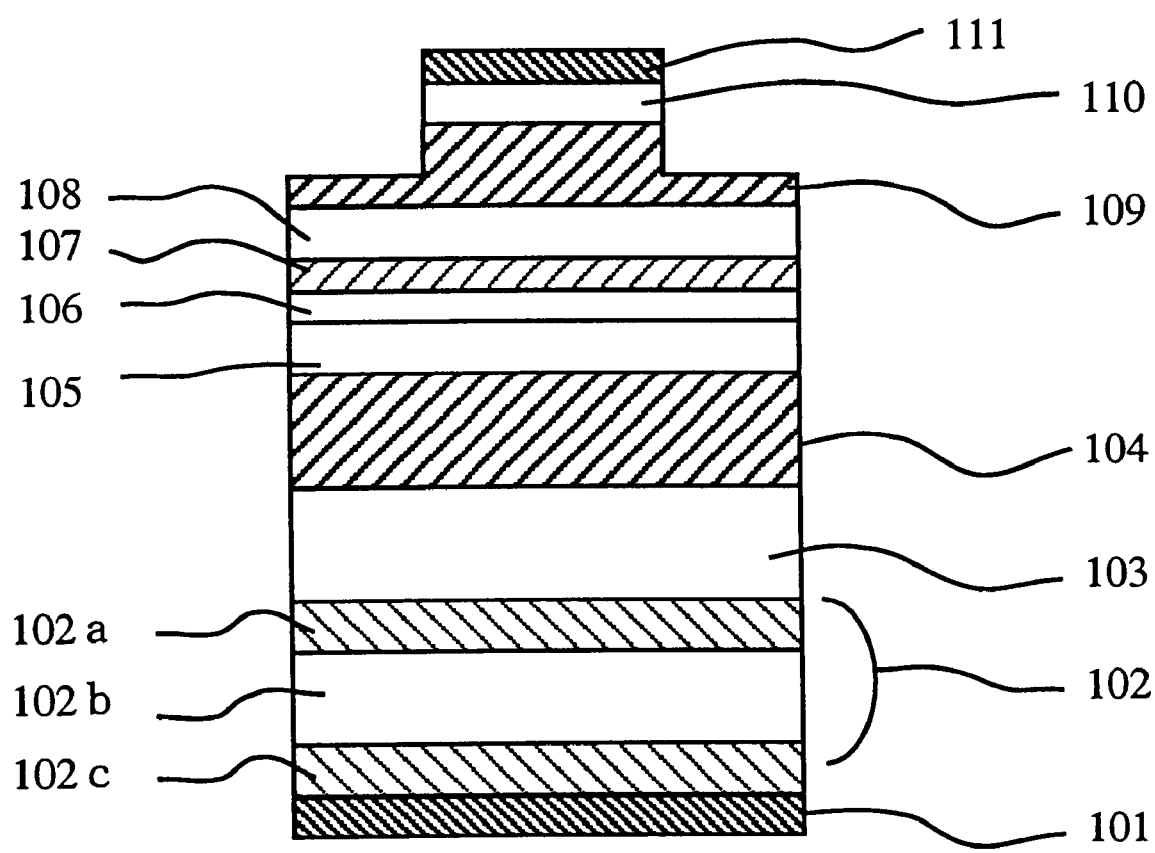
FIGS. 7 to 10 are schematic cross sectional views representing the nitride semiconductor laser devices according to other embodiments of the present invention.

The fifth embodiment differs from the first embodiment in that high impurity concentration regions are provided in two places, namely, growth starting region 102c and growth termination region 102a of thick film substrate 102, as shown in FIG. 7.

Figure 11:
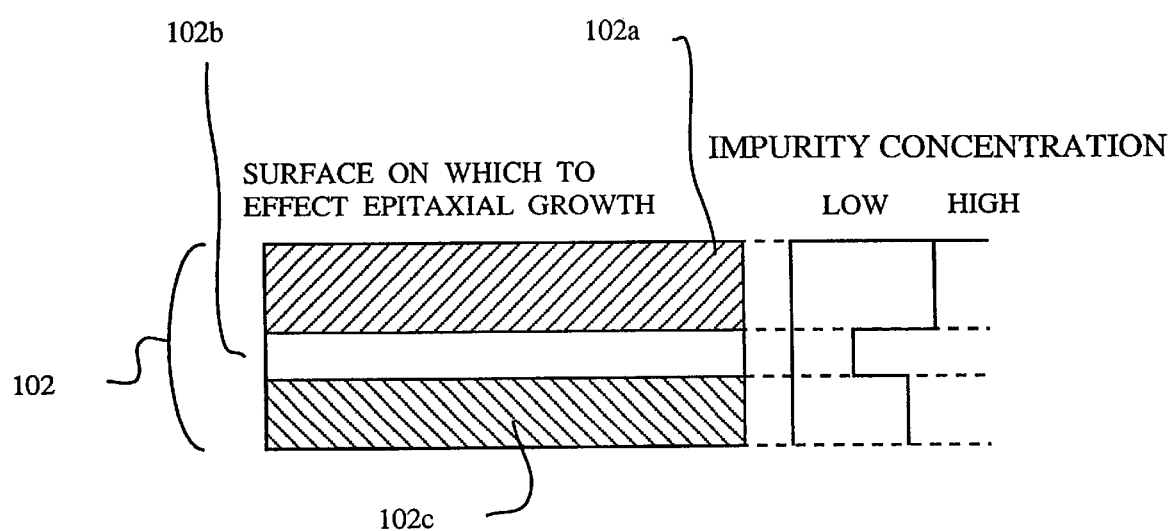
FIGS. 11, 12, and 13 are diagrams showing examples of impurity concentration distributions in nitride semiconductor substrates used for laser devices according to the present invention.

The laser device according to the fifth embodiment, with the impurity concentration in thick film substrate 102 optimized, was observed at the threshold voltage of about 5V and the threshold current density of about 1 kA/cm$^2$ and displayed a long life characteristic. The impurity concentration of a high Si-doped GaN region 102c on which electrode 101 is formed is preferably lower than the impurity concentration of a high Si-doped GaN region 102a on which epitaxial growth is effected. One example of the impurity concentration distribution in the direction of the thickness of the nitride semiconductor substrate used for the fifth embodiment is shown in FIG. 11.

It may be concluded that the increase in the impurity concentration in both the growth starting region 102c and growth termination region 102a allows smooth carrier flow from electrode 101 to a light emitting portion 106, which results in the reduction of the threshold voltage.

Sixth Embodiment

Figure 8:
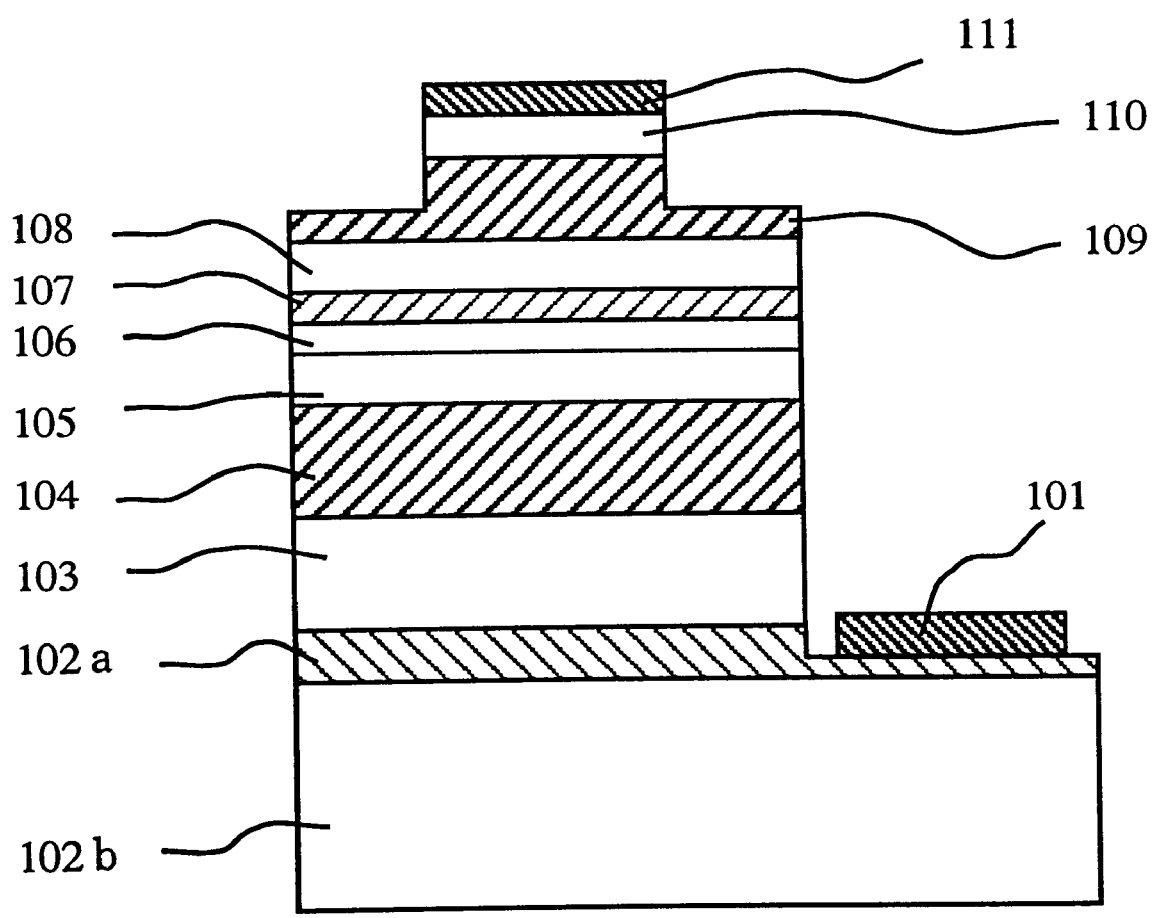
Figure 9:
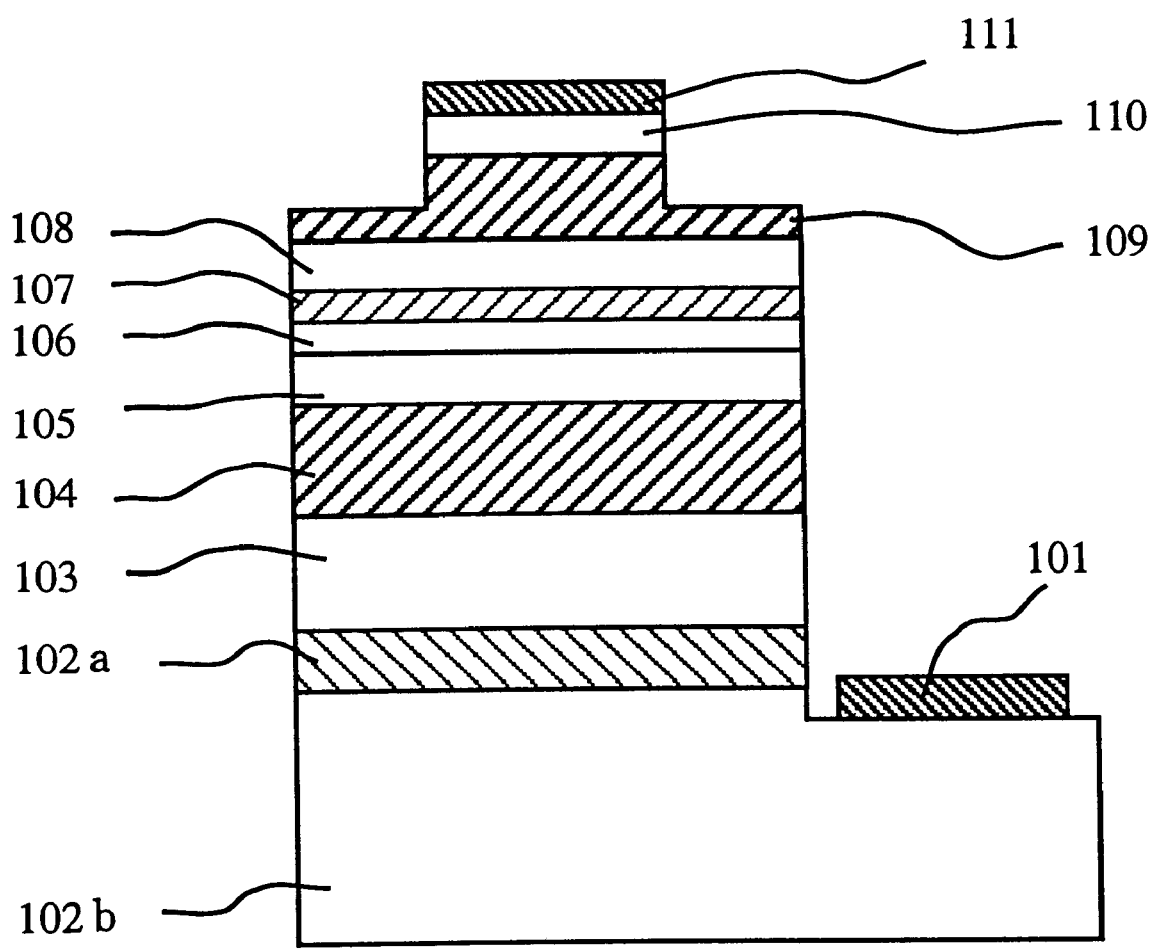

FIGS. 8 and 9 show the laser devices of the sixth embodiment in schematic cross sectional views. The laser devices according to the sixth embodiment are basically produced using a process similar to that of the first embodiment, but differ from the first embodiment in that the position of electrode 101 is changed. In the laser device of FIG. 8, the laser layered structure is first formed on thick film substrate 102, then a portion of a high impurity concentration region 102a in thick film substrate 102 is exposed by reactive ion etching, and then an Al/Ti electrode 101 is formed on the exposed portion. On the other hand, in the laser device of FIG. 9, a portion of a low impurity concentration region 102b in thick film substrate 102 is exposed by similar etching method, and Al/Ti electrode 101 is formed on the exposed portion. Either of the laser devices shown in FIGS. 8 and 9 had a threshold voltage and a threshold current density that are at about the same levels as those of the laser device of the first embodiment and had a good lifetime characteristic. Particularly, in the laser device of FIG. 8, impurity doping for low Si-doped GaN region 102b was not necessarily required so that a good surface flatness of thick film substrate 102 was achieved and the threshold current density was easily reduced.

Seventh Embodiment

Figure 10:
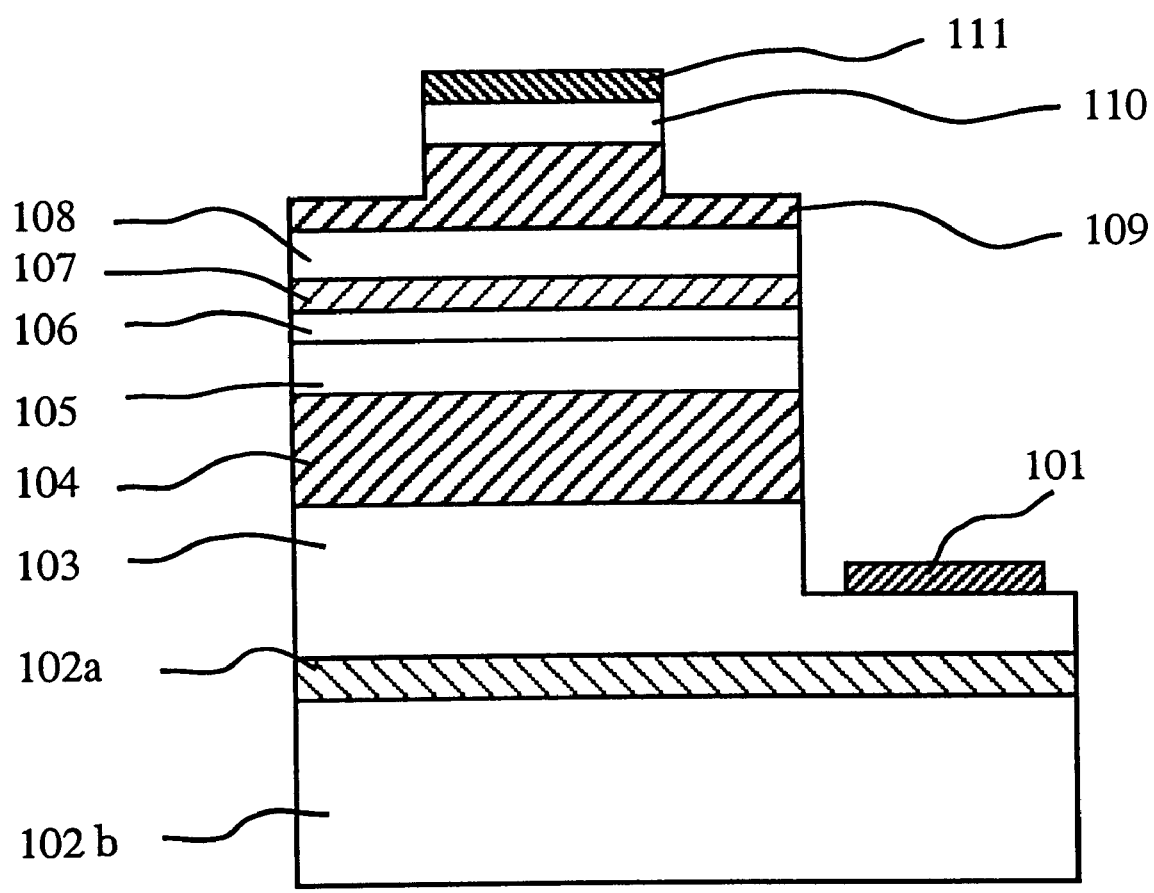

FIG. 10 shows a laser device according to the seventh embodiment in a schematic cross sectional view. The laser device of the seventh embodiment is similar to that of the sixth embodiment, but differs from the latter in that a portion of an n-type GaN buffer layer 103 included in the laser layered structure is exposed by etching and Al/Ti electrode 101 is formed on the exposed portion. In FIG. 10, the electrical contact between GaN thick film substrate 102 and the laser layered structure formed thereon does not directly affect the electric characteristics of the laser device; however, the threshold voltage was reduced by about 1V to 5V since high impurity concentration region 102a was provided in GaN thick film substrate 102. This reduction may be due to the provision of high impurity concentration region 102a relaxing the lattice strain that exists between GaN thick film substrate 102 and the laser layered structure formed thereon, which in turn reduced the carrier trap due to the crystal defect within the epitaxially grown laser layered structure, thereby producing a laser device having good electric characteristics.

Although the H-VPE method and MOCVD method were used as the method of crystal growth in the above-described first to seventh embodiments, other method of thick film growth may be employed. The laser layered structure may also be formed by MBE (Molecular Beam Epitaxy) method and the like. The effects described in the above embodiments were particularly evident when a nitride semiconductor thick film substrate formed by the H-VPE method was used, however. The reason may be that chlorine (Cl) incorporated into the nitride semiconductor thick film substrate during film growth by H-VPE contributes to the effects of the present invention.

Moreover, the source materials used are not limited to TMG, TMA, TMI, NH$_3$, and Cp$_2$Mg, but any source material that allows the growth of a desired compound layer may be utilized. In addition, impurities for the n-type GaN thick film substrate are not limited to Si, O, or Ge, and carbon (C), selenium (Se), sulfur (S), tellurium (Te) or the like may be used.

Furthermore, although the above embodiments describe high impurity concentration region 102a to have the thickness of about 5 μm, any thickness may be used as long as the thickness does not cause undesirable unevenness of the thick film substrate surface. The appropriate thickness for high impurity concentration region 102a may vary according to the impurity concentration; however, the experimental results revealed that it was desirable to set the thickness to be 50 μm or below in order to achieve the effects of the present invention, and it was even more desirable to set the thickness in the range of 2 nm to 10 μm. In addition, when forming a nitride thick film substrate, the method of high doping (δ doping) the surface region (about 50 nm or smaller in thickness) of the substrate proved effective.

Figure 12:
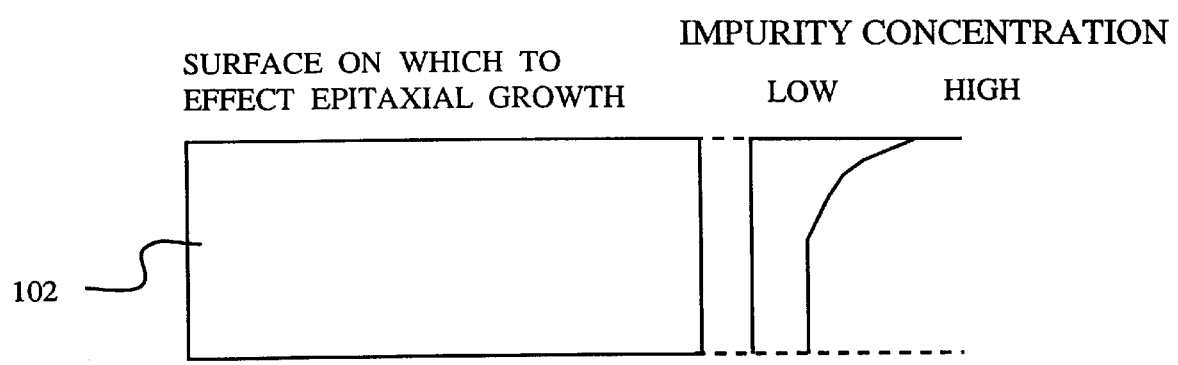
Figure 13:
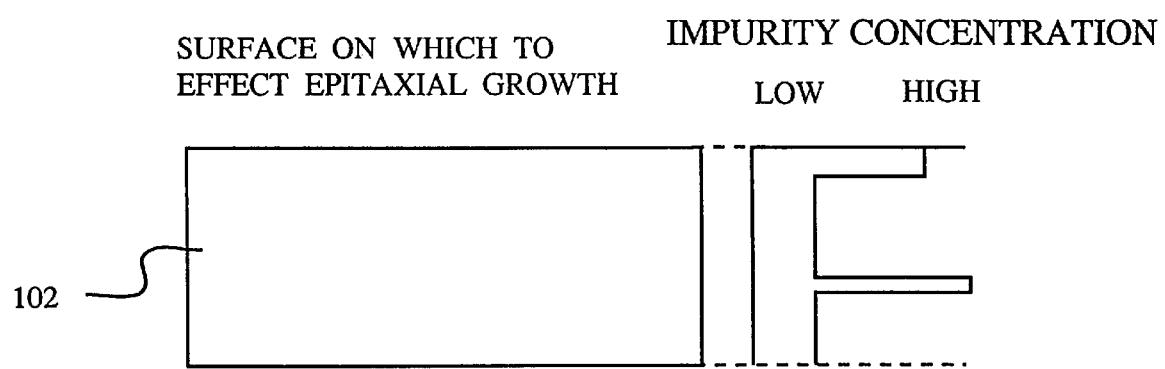

FIGS. 12 and 13 show the impurity concentration profiles in the direction of the thickness of other nitride semiconductor substrates in which the effects of the present invention were observed. FIG. 12 shows the case in which three regions of different impurity concentration gradients exist within GaN thick film substrate 102 and in which the impurity concentration becomes increasingly higher toward the surface on which the laser layered structure is to be formed by epitaxial growth. The impurity concentration region toward the surface on which epitaxial growth takes place being referred to as a first region, the impurity concentration of the first region is higher than the impurity concentration of a second region that is located below the first region.

GaN thick film substrate 102 in FIG. 13 includes, successively from the side on which the epitaxial growth is effected, four impurity concentration regions of a region A, a region B, a region C, and a region D, with region C having the highest impurity concentration. Region A, which is toward the surface on which the epitaxial growth is effected, has a higher impurity concentration relative to regions B and D located below.

Even with the nitride semiconductor substrates having impurity concentration profiles other than those shown in FIGS. 12 and 13, the effects of the present invention were achieved where a region of a lower impurity concentration existed below region A, the regions being termed as region A, region B, region C, and so on starting from the side toward the surface on which the epitaxial growth was to take place.

Furthermore, although the descriptions were given in relation to laser devices as examples of light emitting devices in the above embodiments, the present invention can be applied to the production of a light emitting diode (LED) device to achieve reduced driving voltage and improved flatness of the device surface.

Figure 14:
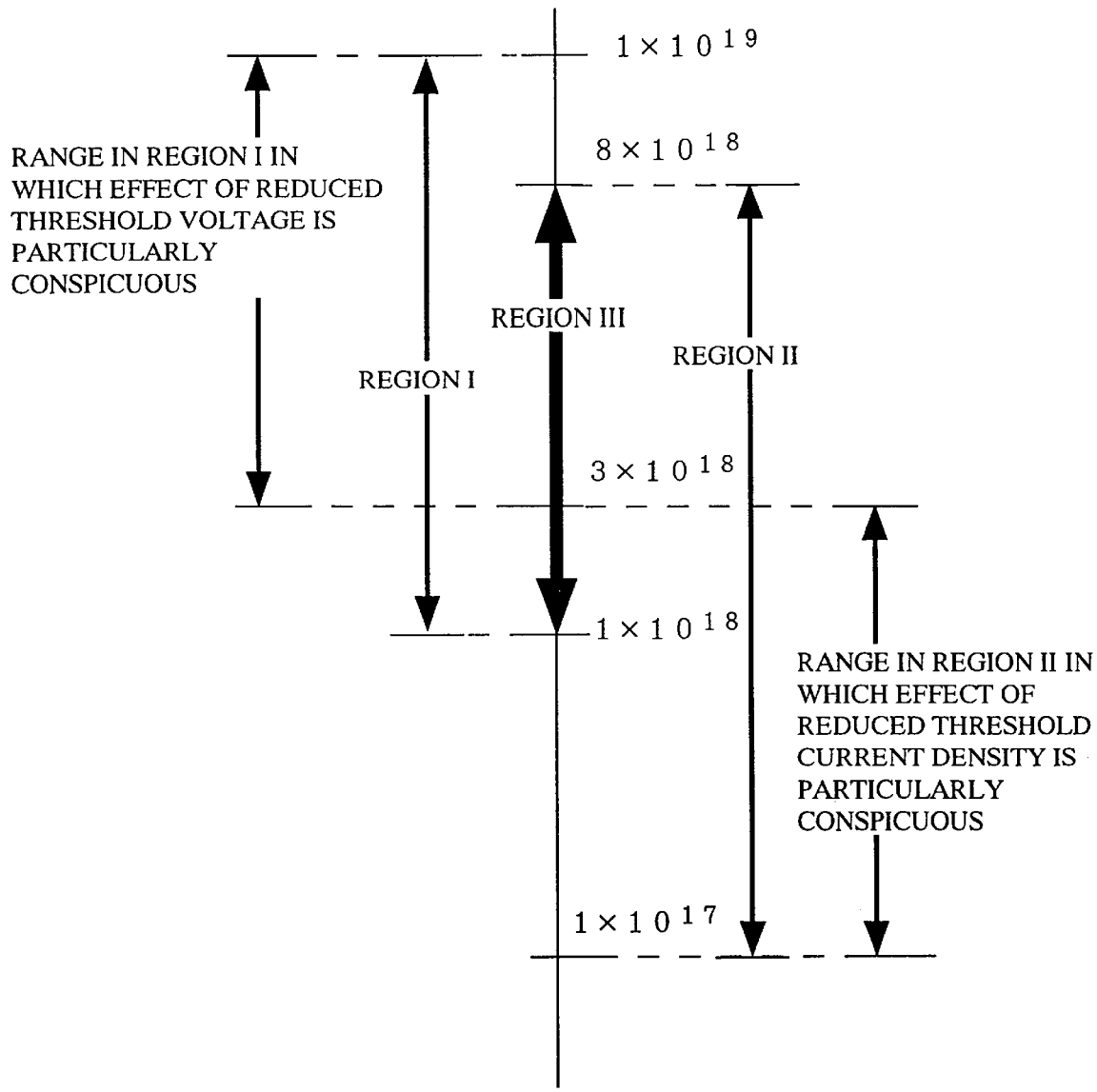
FIG. 14 is a diagram illustrating the relation between the effects of the present invention and the ranges of impurity concentrations in thick film substrates.

Relation Observed between Effects of Present Invention and Impurity Concentrations Ranges The relation between the effects of the present invention and the ranges of the impurity concentrations as recognized from the above-described first and second embodiments and the first comparative example will be described with reference to FIG. 14. FIG. 14 shows the ranges of the impurity concentrations in a region I and a region II. Here, region I represents the range of impurity concentrations in which the effect of reduced threshold voltage can be achieved. As described in relation to the first comparative example, the effect of reduction in the threshold voltage is derived from the reduction in the Schottky barrier generated in the contact region between the substrate and the light emitting layered structure due to impurities added. This effect was observed when the impurity concentration was $1\times10^{18}/cm^3$ or higher. The effect of reduced threshold voltage became particularly obvious when the impurity concentration was in the range of $3\times10^{18}/cm^3$ to $1\times10^{19}/cm^3$. The impurity concentration exceeding $1\times10^{19}/cm^3$ was unfavorable, however, since it resulted in increased crystal defects.

On the other hand, region II represents the range of impurity concentrations in which the effect of reduced threshold current density can be achieved. As described in relation to the first comparative example, the effect of reduction in the threshold current density is derived from the reduction in light dispersion within light propagation layer 105 of the light emitting layered structure due to improvement in the surface roughness of the nitride semiconductor substrate that is achieved by optimizing the impurity concentration. This effect was observed when the impurity concentration was $8\times10^{18}/cm^3$ or lower. The effect of reduced threshold current density became particularly obvious when the impurity concentration was in the range of $1\times10^{17}/cm^3$ to $3\times10^{18}/cm^3$. The impurity concentration below $1\times10^{17}/cm^3$ was unfavorable, however, since it resulted in increased electric resistance.

It can be concluded from the above results that, when a nitride semiconductor substrate includes at least two layer regions having different impurity concentrations corresponding to region I and region II, the light emitting device (laser device) produced with this substrate will easily satisfy both the effects of low threshold voltage and low threshold current density. In order to obtain the effect of low threshold voltage, however, the light emitting layered structure must be formed so as to contact region I, because this effect is obtained as a result of the reduction in the Schottky barrier generated in the contact region between the substrate and the light emitting layered structure.

Therefore, when a nitride semiconductor substrate does not include a plurality of layer regions having different impurity concentrations (that is, when the substrate has a constant, homogenous impurity concentration), the light emitting device (laser device) produced with this substrate cannot satisfy both the effects of low threshold voltage and low threshold current density at the same time (see first comparative example).

In the above description, the effects of the present invention are described only with respect to the effects of reduction in the threshold voltage and reduction in the threshold current density. A further review by the present inventors, however, additionally revealed that the inclusion of two or more different impurity concentration layer regions in the nitride semiconductor substrate not only produced the above-described effects but also brought about the relaxation of the lattice strain between the substrate and the light emitting layered structure. The effect of lattice strain relaxation will be described with reference to FIGS. 1, 4, and 5. Here, to simplify the description, it is assumed that the nitride semiconductor substrate includes only two layer regions, i.e., a layer region A having a high impurity concentration and a layer region B having an impurity concentration that is lower than that of region A. A nitride semiconductor substrate including three or more different impurity concentration layer regions can also be described in the same manner as the following.

In the laser device according to the first embodiment (FIG. 1), a light emitting layered structure 103 to 111 is formed on nitride semiconductor substrate 102 formed of region A or high Si-doped GaN region 102*a* (Si impurity concentration: approximately $8.0\times10^{18}/cm^3$) and region B or low Si-doped GaN region 102*b* (Si impurity concentration: approximately $3.8\times10^{18}/cm^3$).

FIG. 4 shows the relation between the homogenous impurity concentration in nitride semiconductor substrates of the first comparative example and threshold voltage of the light emitting devices (laser devices) produced including the substrates. FIG. 5 shows the relation between the homogenous impurity concentration in nitride semiconductor substrates of the first comparative example and the threshold current density of the light emitting devices (laser devices) produced including the substrates.

The broken lines in FIGS. 4 and 5 indicate the electric characteristics achieved by the laser device according to the first embodiment. The value of threshold voltage indicated by the broken line in FIG. 4 is slightly lower than the threshold voltage value of the light emitting device (laser device) including the substrate whose impurity concentration throughout its entirety is the same as the impurity concentration of region A ($8.0\times10^{18}/cm^3$). Moreover, the threshold current density indicated by the broken line in FIG. 5 also is lower than the threshold current density of the light emitting device including the substrate whose impurity concentration throughout its entirety is the same as the impurity concentration of region B ($3.8\times10^{18}/cm^3$). From the above, it can be seen that the overall effect achieved by a light emitting device (laser device) using a nitride semiconductor substrate having different impurity concentration regions such as region A and region B is not a simple summation of the effect of the low threshold voltage provided by region A and the effect of the low threshold current density provided by region B.

It is understood that the above-described overall effect is due to the lattice strain between the nitride semiconductor substrate and the light emitting layered structure being relaxed as a result of the inclusion of different impurity concentration regions such as region A and region B. The present inventors have discovered that this effect of lattice strain relaxation was observed in proportion to the impurity concentration and that the effect becomes significant when the impurity concentration was $1\times10^{18}/cm^3$ and higher. When the impurity concentration exceeds $1\times10^{19}/cm^3$, however, degradation in the crystallinity of the substrate occurs. Thus, a preferred impurity concentration with which the effect of lattice strain relaxation is achieved is in the range of $1\times10^{18}/cm^3$ to $1\times10^{19}/cm^3$.

The reasons for the further reductions in the threshold voltage and the threshold current density achieved by the effect of lattice strain relaxation will be described below.

The nitride semiconductor laser device of FIG. 1 has a region B, a region A, and a light emitting layered structure stacked in this order. Region A 102a and region B 102b included in substrate 102 have different impurity concentrations but are both mainly formed of GaN. On the other hand, the light emitting layered structure is similarly formed by a nitride semiconductor, but it also includes layers formed of materials such as AlGaN having a smaller lattice constant than GaN, InGaN having a larger lattice constant, and so on besides GaN. Thus, it is conceivable that lattice strain due to lattice mismatch occurs between the substrate (including region A and region B) and the light emitting layered structure.

Region A 102a, having a higher impurity concentration than region B 102b, however, strongly acts toward relaxing the lattice strain as described above so that the lattice strain between the light emitting layered structure and region B is relaxed through region A. This relaxing of the lattice strain affords the effect of low threshold current density derived from the decrease in the crystal defect within the light emitting layered structure and the effect of low threshold voltage produced from the reduction in the carrier trap caused by the crystal defect.

Thus, as shown in FIGS. 4 and 5, the light emitting device utilizing a nitride semiconductor substrate including both regions A and B of two different impurity concentrations offers lower values in the threshold voltage and the threshold current density when compared with the light emitting device utilizing a nitride semiconductor substrate including only one of region A and region B.

In other words, the inclusion of at least two regions of different impurity concentrations in the nitride semiconductor substrate relaxes the lattice strain between the substrate and the light emitting layered structure, thereby lowering the threshold voltage and the threshold current density.

Next, the effect of relaxation of the lattice strain by the nitride substrate shown in FIG. 13 will be described. As seen in FIG. 13, nitride semiconductor substrate 102 is formed by four regions of different impurity concentrations. Starting from the side toward the surface on which the epitaxial growth takes place, these four different impurity concentration regions will herein be referred to as region A, region B, region C, and region D. Thus, the light emitting layered structure (laser structure) is formed in contact with region A. It is assumed here that regions A and C correspond to region I, and regions B and D correspond to region II of FIG. 14. Based on this assumption, the effect produced by the plurality of impurity concentration regions included in the nitride semiconductor substrate of FIG. 13 for the light emitting device (laser device) will be described.

Region A, its impurity concentration range belonging to region I, reduces the Schottky barrier generated in a region where region A contacts the light emitting layered structure and produces the effect of low threshold voltage for the light emitting device. In addition, since the impurity concentration of region A is higher than that of region B or region D, region A acts as a buffering layer for relaxing the lattice strain between the nitride semiconductor substrate and the light emitting layered structure. Regions B and D, their impurity concentration ranges belonging to region II, bring about the effect of low threshold current density for the light emitting device. Although the impurity concentration range of region C belongs to region I, region C is not in direct contact with the light emitting layered structure so that region C produces very little effect of low threshold voltage for the light emitting device. Region C, however, has the highest impurity concentration relative to other regions so that it may contribute significantly as a buffering layer for relaxing the lattice strain between the nitride semiconductor substrate and the light emitting layered structure. In this manner, the electric characteristics of the light emitting device using the nitride semiconductor substrate of FIG. 13 can be improved.

Now, the case in which the plurality of different impurity concentration regions included in the nitride semiconductor substrate belong to a region III (the impurity concentration being in the range of $1\times10^{18}/cm^3$ to $8\times10^{18}/cm^3$) shown in FIG. 14 will be described. As shown in FIG. 14, region III represents the impurity concentration range in which both effects of region I and region II are obtained. Strictly speaking, within region III, the effect of region I is dominant where the impurity concentration is in the range of $3\times10^{18}/cm^3$ to $8\times10^{18}/cm^3$, while the effect of region II is dominant where the impurity concentration is in the range of $1\times10^{18}/cm^3$ to $8\times10^{18}/cm^3$. Moreover, when the entire substrate has a constant, homogenous impurity concentration (that is, when only one impurity concentration region exists), the impurity concentration at which the effects of threshold voltage and the threshold current density are most effectively produced is $3\times10^{18}/cm^3$. In this case, however, the substrate does not include a plurality of different impurity concentration regions so that the above-described effect of lattice strain relaxation is not achieved. Furthermore, as previously described, a desirable thickness of the high impurity concentration region is 50 $\mu$m or smaller, and a more desirable thickness is 10 $\mu$m or smaller; consequently, the substrate having a homogenous impurity concentration is accordingly restricted in thickness to 50 $\mu$m and below, or 10 $\mu$m and below.

Figure 15:
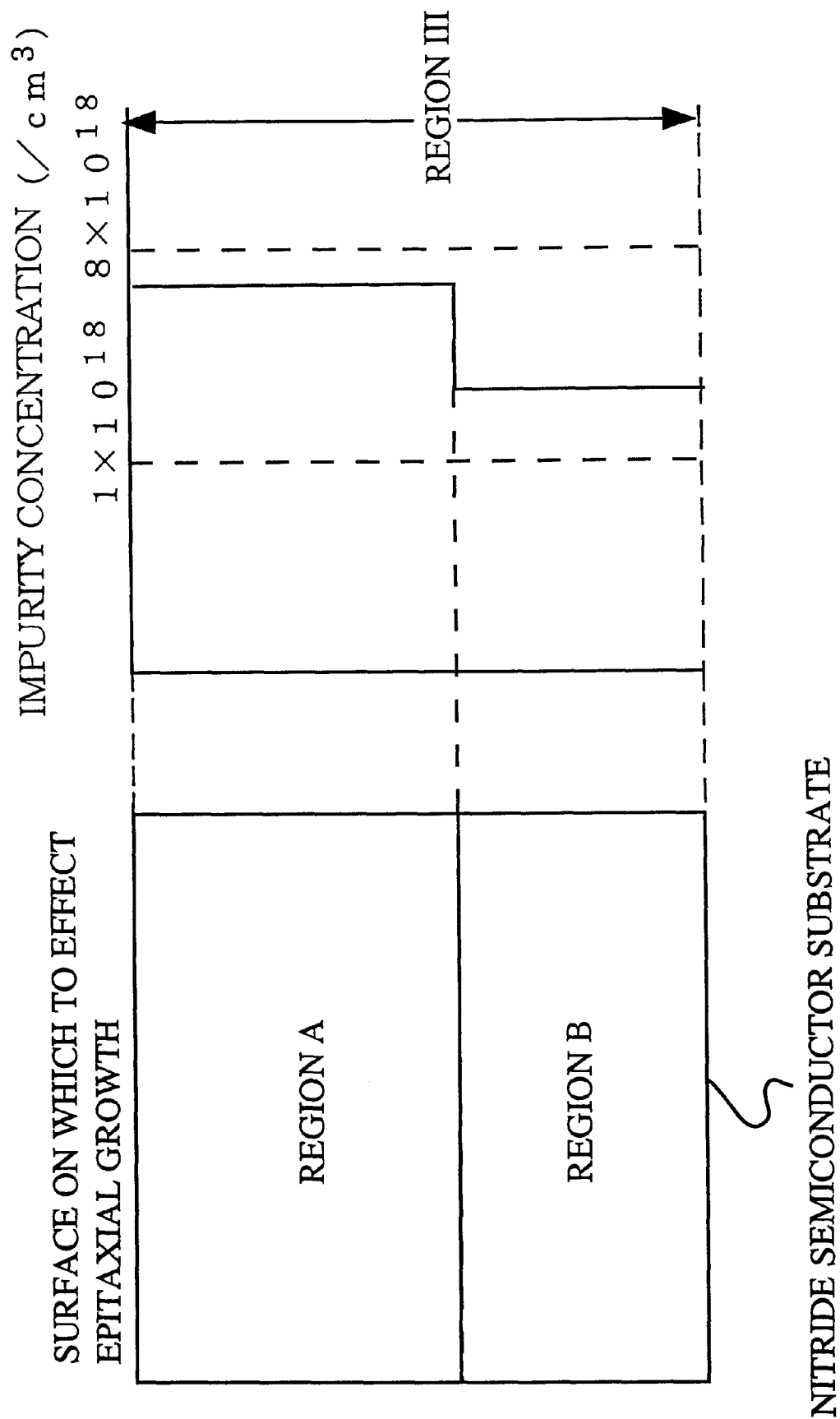
FIGS. 15, 16, and 17 are diagrams showing other examples of impurity concentration distributions in nitride semiconductor substrates according to the present invention.

Next, the case in which the plurality of different impurity concentration regions included in a nitride semiconductor substrate all belong to region III will be described with reference to FIG. 15. FIG. 15 shows the impurity concentration distribution within the nitride semiconductor substrate. Here, the regions of plurality of impurity concentrations will be referred to as a region A and a region B from the side toward the surface on which epitaxial growth is to be effected. Thus, the light emitting layered structure (laser structure) is formed in contact with region A. As seen from FIGS. 14 and 15, region A and region B both correspond to region III.

The effects provided to the light emitting device by the plurality of impurity concentration regions forming the nitride semiconductor substrate of FIG. 15 are as follows. First, both the effects of decreased threshold voltage and decreased threshold current density can be expected from region A, the impurity concentration of which belongs to region III. Region A, however, acts mainly to produce the effect of reduced threshold voltage, since region A is in contact with the light emitting layered structure and has impurity concentration that is higher than that of region B. Moreover, region A, having a higher impurity concentration than region B, may contribute as a buffering layer for relaxing the lattice strain between the nitride semiconductor substrate and the light emitting layered structure. On the other hand, since the impurity concentration of region B also belongs to region III, both effects of decreased threshold voltage and decreased threshold current density can be expected from region B as well. Region B, however, acts mainly to produce the effect of decreased threshold current density, since the impurity concentration of region B is lower than that of region A.

Figure 16:
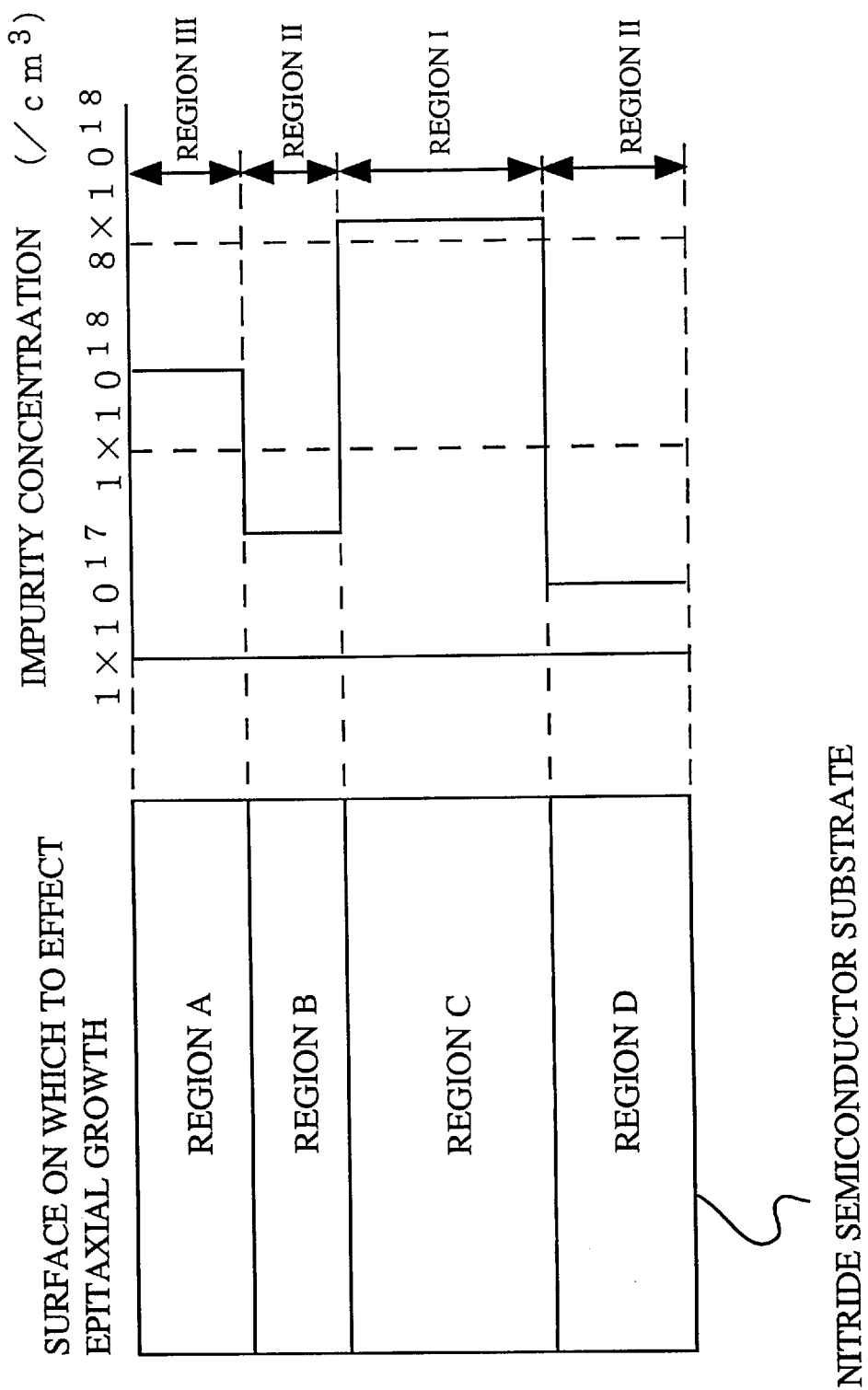

Now, the case where a nitride semiconductor substrate is formed from four different impurity concentration regions will be described in relation to FIG. 16. FIG. 16 shows the impurity concentration distribution within the nitride semiconductor substrate. Here, the regions of plurality of impurity concentrations will be referred to as regions A, B, C, and D from the side toward the surface on which epitaxial growth is to be effected. The light emitting layered structure (laser structure) is formed in contact with region A. Region A corresponds to region III, regions B and D correspond to region II, and region C corresponds to region I.

The effects provided to the light emitting device by the every impurity concentration region forming the nitride semiconductor substrate of FIG. 16 are as follows. First, both effects of decreased threshold voltage and decreased threshold current density can be expected from region A, the impurity concentration of which belongs to region III. Region A, however, acts mainly to produce the effect of reduced threshold voltage, since region A is in contact with the light emitting layered structure. Moreover, region A, which has an impurity concentration that is higher than region B, may contribute as a buffering layer for relaxing the lattice strain between the nitride semiconductor substrate and the light emitting layered structure. On the other hand, since the impurity concentrations of regions B and D belong to region II, regions B and D act to produce the effect of decreased threshold current density for the light emitting device. Furthermore, although its impurity concentration range belongs to region I, region C is not in direct contact with the light emitting layered structure so that region C may contribute to a large extent as a buffering layer for relaxing the lattice strain between the nitride semiconductor and the light emitting layered structure due to its highest impurity concentration relative to other impurity regions rather than achieve the effect of low threshold voltage due to the reduction in the Schottky barrier generation (this is because the region C is not indirect contact with the light emitting layered structure.) In this manner, the electric characteristics of the light emitting device using the nitride semiconductor substrate of FIG. 16 can be improved.

Next, the case where a nitride semiconductor substrate having a continuously changing impurity concentration distribution will be described with reference to FIG. 17. Here, the description will be given with respect to the continuous impurity concentration profile shown in FIG. 17 appropriately divided into four regions. The regions of plurality of impurity concentrations will be referred to as regions A, B, C, and D starting from the side toward the surface on which epitaxial growth is to be effected. Thus, the light emitting layered structure (laser structure) is formed in contact with region A. Regions A and C correspond to region III, region B corresponds to region I, and region D corresponds to region II.

Figure 17:
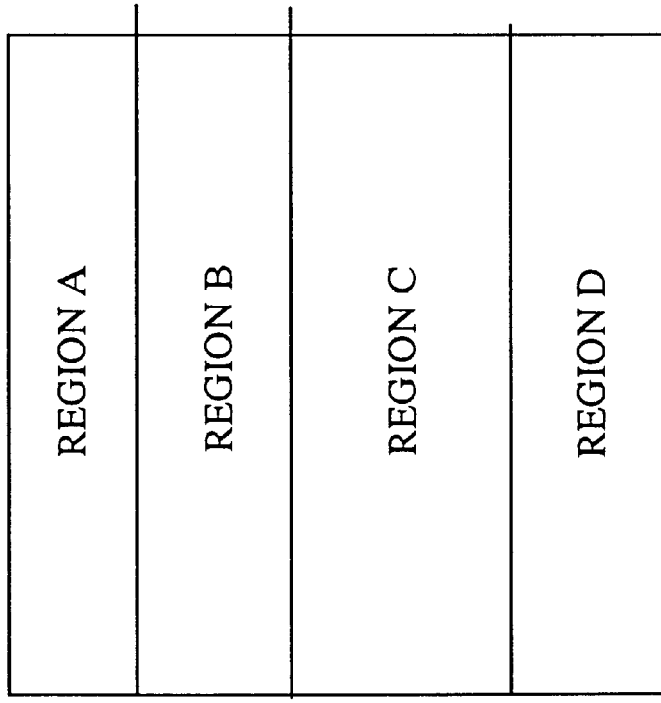

The effects provided to the light emitting device by the plurality of impurity concentration regions forming the nitride semiconductor substrate of FIG. 17 are as follows. First, both effects of decreased threshold voltage and decreased threshold current density can be expected from region A, since the impurity concentration of region A belongs to region III. Region A, however, acts mainly to produce the effect of reduced threshold voltage, since region A is in contact with the light emitting layered structure. Moreover, the impurity concentration in region A decreases from the boundary between region A and region B toward the interface between region A and the light emitting layered structure so that region A may act to alleviate the degradation of the crystallinity in the vicinity of the interface between the substrate and the light emitting layered structure due to the added impurities. Furthermore, by changing the impurity concentration in a continuous manner, the resistance in the boundary region between region A and region B can be kept low as opposed to the case in which the impurity concentration is discontinuously (drastically) changed, as shown in FIG. 15 or FIG. 16, for instance.

On the other hand, although its impurity concentration range belongs to region I, region B is not in direct contact with the light emitting layered structure so that region B, rather than to achieve the effect of reduced threshold voltage, contributes as a buffering layer for relaxing the lattice strain between the nitride semiconductor substrate and the light layered element structure due to its highest impurity concentration relative to other impurity regions. Moreover, since continuously changed impurity concentration allows continuous dispersion of the lattice strain, the effect of lattice strain relaxation is effectively achieved.

Both the effects of decreased threshold voltage and decreased threshold current density can be expected from region C, the impurity concentration of which belongs to region III. Region C, however, acts to produce the effect of reduced threshold current density rather than the effect of reduced threshold voltage, since it is not in direct contact with the light emitting layered structure. Furthermore, by changing the impurity concentration continuously, the resistance in the boundary region between region B and region C can be kept low. Region D, with its impurity concentration range belonging to region II, acts to produce the effect of reduced threshold current density for the light emitting device. In this manner, the electric characteristics of the light emitting device using the nitride semiconductor substrate of FIG. 17 can be improved.

In the various embodiments described above, the light emitting layered structure may be formed on the nitride semiconductor thick film substrate after the substrate surface is polished.

As described above, according to the present invention, a nitride semiconductor light emitting device having excellent characteristics may be provided using a nitride semiconductor thick film substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting device, comprising:

a nitride semiconductor substrate; and a light emitting layered structure including a plurality of nitride semiconductor layers stacked on said nitride semiconductor substrate, wherein said nitride semiconductor substrate includes at least two layer regions including a first layer region of a high impurity concentration and a second layer region of an impurity concentration that is lower than said first layer region, and the bottom of said light emitting layered structure is in direct contact with said first layer region of said substrate.

2. The nitride semiconductor light emitting device according to claim 1, wherein all the layer regions in said nitride semiconductor substrate are of n-type conductivity.

3. The nitride semiconductor light emitting device according to claim 2, wherein said first layer region of said nitride semiconductor substrate includes conductivity-type determining impurities for n-type.

4. The nitride semiconductor light emitting device according to claim 1, wherein a kind of impurity included in said nitride semiconductor substrate is selected from the group consisting of silicon, germanium, oxygen, carbon, sulfur, selenium, and tellurium.

5. The nitride semiconductor light emitting device according to claim 1, wherein the impurity concentration of said first layer region of said nitride semiconductor substrate is not less than $1 \times 10^{18}$ cm$^{-3}$.

6. The nitride semiconductor light emitting device according to claim 1, wherein said nitride semiconductor substrate includes a layer region having a lowest impurity concentration of not more than $8 \times 10^{18}$ cm$^{-3}$.

7. The nitride semiconductor light emitting device according to claim 1, wherein said first layer region of said nitride semiconductor substrate has a thickness that is not greater than 10 µm.

8. A nitride semiconductor light emitting device, comprising:

a nitride semiconductor substrate; and a plurality of epitaxial growth layers including a light emitting layered structure stacked on said nitride semiconductor substrate, wherein said nitride semiconductor substrate includes at least two layer regions including a first layer region of a high impurity concentration and a second layer region of an impurity concentration that is lower than said first layer region, and the bottom of said epitaxial growth layers including a light emitting layered structure is in direct contact with said first layer region of said substrate.

9. The nitride semiconductor light emitting device according to claim 8, wherein all the layer regions in said nitride semiconductor substrate are of n-type conductivity.

10. The nitride semiconductor light emitting device according to claim 9, wherein said first layer region of said nitride semiconductor substrate includes conductivity-type determining impurities for n-type.

11. The nitride semiconductor light emitting device according to claim 8, wherein a kind of impurity included in said nitride semiconductor substrate is selected from the group consisting of silicon, germanium, oxygen, carbon, sulfur, selenium, and tellurium.

12. The nitride semiconductor light emitting device according to claim 8, wherein the impurity concentration of said first layer region of said nitride semiconductor substrate is not less than $1 \times 10^{18}$ cm$^{-3}$.

13. The nitride semiconductor light emitting device according to claim 8, wherein said nitride semiconductor substrate includes a layer region having a lowest impurity concentration of not more than $8 \times 10^{18}$ cm$^{-3}$.

14. The nitride semiconductor light emitting device according to claim 8, wherein said first layer region of said nitride semiconductor substrate has a thickness that is not greater than 10 µm.

* * * * *